US008655471B2

(12) United States Patent
Kawahara

(10) Patent No.: US 8,655,471 B2
(45) Date of Patent: Feb. 18, 2014

(54) IMPURITY AMOUNT CONTROL SYSTEM FOR MANUFACTURING SINGLE CRYSTAL AND IMPURITY AMOUNT CONTROL METHOD FOR MANUFACTURING SINGLE CRYSTAL

(75) Inventor: Kenji Kawahara, Tokyo (JP)

(73) Assignee: Sumco Corporation (JP)

(*) Notice: Subject to any disclaimer, the term of this patent is extended or adjusted under 35 U.S.C. 154(b) by 1906 days.

(21) Appl. No.: 11/655,508

(22) Filed: Jan. 18, 2007

(65) Prior Publication Data
US 2008/0177422 A1 Jul. 24, 2008

(30) Foreign Application Priority Data

Jan. 20, 2006 (JP) ................................ 2006-011908

(51) Int. Cl.
*G06F 19/00* (2011.01)
(52) U.S. Cl.
USPC ............ 700/121; 700/266; 700/268; 117/932
(58) Field of Classification Search
USPC ............................ 700/268, 121, 266; 117/932
See application file for complete search history.

(56) References Cited

U.S. PATENT DOCUMENTS

| | | | | |
|---|---|---|---|---|
| 4,134,785 A | * | 1/1979 | Lavigna et al. | 117/15 |
| 5,485,803 A | * | 1/1996 | Habu | 117/14 |
| 5,814,148 A | * | 9/1998 | Kim et al. | 117/13 |
| 6,036,346 A | * | 3/2000 | Hino et al. | 700/121 |
| 6,179,914 B1 | * | 1/2001 | Aydelott | 117/200 |

FOREIGN PATENT DOCUMENTS

| | | |
|---|---|---|
| JP | 10-273310 | 10/1998 |
| JP | 2004-224582 | 8/2004 |
| JP | 2005-112669 | 4/2005 |

OTHER PUBLICATIONS

Japanese Office Action dated Nov. 30, 2010 issued in connection with counterpart Japanese Patent Application No. 2006-011908.

* cited by examiner

*Primary Examiner* — Jonathan Hurst
(74) *Attorney, Agent, or Firm* — Kolisch Hartwell, P.C.

(57) ABSTRACT

This impurity amount control system for manufacturing a single crystal has a resistivity profile memory which stores a resistivity profile for a portion of a single crystal that is rendered into wafers; a simulator which determines a resistivity profile formula for indicating a resistivity profile within a reusable ingot that is the reusable material in the single crystal from an impurity concentration estimating formula including one or more variables selected from among resistivities at both ends of the reusable ingot in the crystal growth axis direction, the impurity concentration when crystal pulling begins, a segregation coefficient, a solidification ratio and a correction coefficient, and from the resistivity profile; and an impurity amount calculator which calculates, based on the resistivity profile formula, the amount of impurity within the reusable ingot.

1 Claim, 7 Drawing Sheets

FIG. 2

| INGOT IDENTIFICATION NUMBER | SINGLE CRYSTAL IDENTIFICATION NUMBER | PULLER NUMBER | OPERATOR IDENTIFICATION NUMBER | SEQUENCE NUMBER | RESISTIVITY INFORMATION | PART INFORMATION | POSITION INFORMATION | AMOUNT OF IMPURITY |
|---|---|---|---|---|---|---|---|---|
| XXX123 | △△224 | K281 | 12336 | 12 | ρTop, ρBot | BODY | Tx1-Bx1 | sy (g) |
| XXX124 | △△228 | K244 | 12334 | 34 | ρTop, ρBot | TOP | Tx2-Bx2 | fy (g) |

FIG. 3

| SINGLE CRYSTAL IDENTIFICATION NUMBER | PULLER NUMBER | OPERATOR IDENTIFICATION NUMBER | SEQUENCE NUMBER | RESISTIVITY PROFILE INFORMATION |
|---|---|---|---|---|
| △△102 | K281 | 12336 | 12 | F24 |
| △△236 | K252 | 32144 | 29 | F25 |

| SINGLE CRYSTAL IDENTIFICATION NUMBER | PULLER NUMBER | OPERATOR IDENTIFICATION NUMBER | SEQUENCE NUMBER | REFERENCE RESISTIVITY PROFILE INFORMATION |
|---|---|---|---|---|
| △△102 | K281 | 12336 | 12 | R234 |
| △△236 | K252 | 32144 | 29 | R123 |

IMPURITY AMOUNT CONTROL SYSTEM FOR MANUFACTURING SINGLE CRYSTAL AND IMPURITY AMOUNT CONTROL METHOD FOR MANUFACTURING SINGLE CRYSTAL

BACKGROUND OF THE INVENTION

1. Technical Field

The present invention relates to a manufacturing control system and a manufacturing control method for growing a single crystal in which the resistivity is controlled to a desired value.

This application claims priority from Japanese Patent Application No. 2006-011908, filed on Jan. 20, 2006, the content of which is incorporated herein by reference.

2. Background Art

In recent years, there has been a desire to increase the capacity of LSI devices, and the development of manufacturing technology for achieving this end is also required. Large numbers of silicon wafers are used in manufacturing technology for semiconductor circuits such as IC and LSI devices.

Such silicon wafers are fabricated by adding a given proportion of impurity to a silicon starting material and creating by crystal growth a cylindrical crystal body called a single crystal which has a desired resistivity, cutting the single crystal into a cylindrical body of a given length in the axial direction called an ingot, then slicing the ingot into sections of a required thickness.

One method for growing such single crystals is the Czochralski method (referred to below as the "CZ method"). The grown single crystal is sliced to form wafers having the qualities required by the user (e.g., thickness, diameter dimensions, resistivity, and etch pit density), and then the wafers are shipped to the respective users.

However, as shown in FIG. 8, in a single crystal that has been manufactured, there are regions where the qualities required by the user are not met; that is, portions where the electrical characteristics are not fully satisfied, such as quality loss (resistivity) and EPD loss (the etch pit density exceeds a prescribed value). Or there are portions which, although satisfactory in terms of these electrical characteristics, are not monocrystalline on visual examination, and portions where dislocations have occurred or cracks associated with such dislocations exist. Moreover, there are portions of the single crystal where the diameter falls outside of the error range and does not satisfy the prescribed values, namely the conical top portion where crystal pulling and growth was begun (top loss) and the conical bottom portion where crystal growth was brought to an end (bottom loss).

The above-mentioned quality loss, EPD loss, top loss and tail loss portions which do not meet the quality requirements of the user become, of course, unshipped material which is not sliced into wafers and shipped as finished product.

In order to grow a single crystal for such wafer production and also achieve a predetermined impurity concentration, use is made of high-purity impurity materials and silicon materials. In particular, impurity materials are expensive, as are also silicon polycrystalline materials because of their high purity. Hence, discarding such unshipped material amounts to throwing away high-cost impurity material, which increases the production costs involved in growing a single crystal, and in turn drives up the production costs for wafers.

In order to lower the proportion of the production costs accounted for by the impurity material, cyclic production methods that reuse the impurity material present within the above-described unshipped material are being adopted.

In general, the portions of an ingot which satisfy the quality requirements of the user are sliced from the ingot to prepare wafers, leaving behind the above-described unshipped material portions as reusable ingots. Such reusable ingots held in stock are used during recycling (e.g., see Patent Document 1).

In the method of recycling unshipped material described in Patent Document 1, at the time of reuse, the amount of impurity present in the unshipped material is estimated and a new single crystal is grown using one or a plurality of pieces of unshipped material.

Here, in prior-art examples in Patent Document 1 and elsewhere, and as shown also in FIG. 8, the resistivities at the top and bottom sides of the reusable ingot are measured, and a single representative value (e.g., an average value) determined from these resistivities is obtained and placed on a label or the like together with the weight of the reusable ingot, which is then stored.

When a single crystal is to be produced using this reusable ingot, the amount of impurity present in the reusable ingot is calculated based on the representative value for the above-described resistivity and the weight value for the reusable ingot, and the reusable ingot is used as the impurity material added to the silicon starting material.

However, in prior-art examples, when the amount of impurity contained in a single reusable ingot is calculated from the representative value, because the reusable ingot as a whole contains on average the impurity in the impurity concentration indicated by the representative value, there is a problem in that the calculated amount of impurity will end up deviating from the amount of impurity actually contained as impurity concentrations having distributions in the single crystal axial and radial directions of the reusable ingot.

That is, in prior-art examples, because the profile (axial direction of single crystal) of the resistivity within the reusable ingot is unclear, the above-mentioned representative value will not necessarily be representative of the actual reusable ingot resistivity, thus making it impossible to calculate the correct amount of impurity and preventing the desired resistivity from being achieved in the single crystal that has been grown.

The present invention was ultimately arrived at in light of the above circumstances. The object of the invention is to provide an impurity amount control system and an impurity amount control method for manufacturing a single crystal which, by accurately estimating the amount of impurity contained within reusable ingots and effectively utilizing the reusable ingots, are able to grow single crystals of a desired resistivity.

Patent Document 1: Japanese Patent Application, First Publication No. 2005-112669.

SUMMARY OF THE INVENTION

The impurity amount control system for manufacturing a single crystal of the present invention is a system for carrying out, in a single crystal grown by a crystal pulling method, impurity amount control when using a portion of a single crystal that is not sliced into wafers as a reusable ingot for growing another single crystal. The impurity amount control system includes a resistivity profile memory which stores a resistivity profile for another portion of the single crystal from which a reusable ingot is collected; a simulator which calculates a resistivity profile formula for indicating a resistivity profile within the reusable ingot from an impurity concentration estimating formula that includes one or more variables selected from among resistivities at both ends of the reusable ingot in the crystal growth axis direction, the impurity concentration when crystal pulling begins, a segregation coefficient, a solidification ratio and a correction factor, and from the resistivity profile; and an impurity amount calculator which calculates, based on the resistivity profile formula, the amount of impurity within the reusable ingot.

The impurity amount control method for manufacturing a single crystal of the present invention is a method for running an impurity amount control system for manufacturing a single crystal which carries out, in single crystal growth by a crystal pulling process, impurity amount control when using a portion of a single crystal that is not sliced into wafers as reusable material for growing another single crystal. The impurity amount control method includes: storing a resistivity profile for a portion of the single crystal that is rendered into wafers in a resistivity profile memory; simulating to determine, by a simulator, a resistivity profile formula for indicating a resistivity profile within a reusable ingot that is the reusable material in the single crystal from an impurity concentration estimating formula including one or more variables selected from among the resistivities at both ends of the reusable ingot in the crystal growth axis direction, the impurity concentration when crystal pulling begins, a segregation coefficient, a solidification ratio and a correction factor, and from the resistivity profile; and calculating using an impurity amount calculator, based on the resistivity profile formula, the amount of impurity within the reusable ingot.

The foregoing arrangements make it possible to determine, from a general impurity concentration estimating formula and another resistivity profile that is already known, to a higher accuracy than in prior-art examples, the profile of a reusable ingot which is previously capable of being inferred only from the resistivity values at both ends of the ingot.

That is, the impurity amount control system for manufacturing a single crystal of the present invention, instead of obtaining the representative value as the average value in the manner of prior-art examples, fits the resistivities at the top and bottom sides of the ingot to a resistivity distribution profile for a single crystal produced in the past, and estimates the representative value from that corresponding profile.

The already known resistivity profile may conceivably be a profile created by arranging, in the growth axis direction, the measured resistivities of individual wafers sliced as finished products from the same single crystal from which the reusable ingot is collected.

The impurity amount control system for manufacturing a single crystal of the present invention may further include a reference resistivity profile history memory which stores therein a reference resistivity profile in the axial direction for a single crystal grown in the past and having similar resistivity, and the simulator may determine a profile formula for indicating the resistivity profile within the reusable ingot by correcting the impurity concentration estimating formula with the reference resistivity profile, calculating a tentative profile formula, and fitting the tentative profile formula to the resistivity profile.

With the foregoing arrangement, even when the resistivities of single crystals produced in the past differ, because they are stored as different reference resistivity profiles, unlike representative values of the type used in the prior art, the resistivity profiles in reference ingots can be accurately estimated, enabling an accurate estimate of the amount of impurity in a reusable ingot to be obtained.

The impurity amount control system for manufacturing a single crystal of the present invention may further include a reusable ingot information memory that stores, for each reusable ingot, sequence information including any one or combination of a single crystal identification number which individually identifies a single crystal, a puller identification number for the crystal puller by which the single crystal is grown, single crystal position information in the axial direction of the single crystal, and single crystal bibliographic information which includes the amount of starting material charged, length of single crystal growth, and single crystal diameter information; the reference resistivity profile history memory may have, for each reference resistivity profile, profile information including any one or combination of the puller identification number, the single crystal position information, and the single crystal bibliographic information; and the simulator may select from the reference resistivity profile history memory, a reference resistivity profile containing profile information equivalent to that for the reusable ingot for which the amount of impurity is to be calculated, and may determine a tentative profile formula.

With the foregoing arrangement, because reference resistivity profiles for single crystals produced in the past are prepared for each combination of factors affecting the resistivity, including the crystal puller, the single crystal position information and the single crystal bibliographic information, the amount of impurity can be accurately estimated for the profiles of reusable ingots collected from single crystals.

Moreover, because it suffices to be able to identify a reference resistivity profile, all of the information (namely, single crystal identification numbers which individually identify single crystals, puller identification numbers for the crystal puller by which the single crystal is grown, single crystal position information in the axial direction of the single crystal, and single crystal bibliographic information which includes the amount of starting material charged, length of single crystal growth, and single crystal diameter information) is not needed. A reference resistivity profile may be identified either with a combination of multiple pieces of the information or with any one piece of the information, such as information having a large influence on changes in resistivity.

In the impurity amount control system for manufacturing a single crystal of the present invention, the reusable ingot information memory may store sequence information for, as recycling material, each solidified mass of residual liquid remaining within the crucible used in the crystal pulling operation.

This arrangement enables a polycrystalline solidified mass of the residual liquid including silicon and impurity that invariably remains in the crucible after single crystal growth to be reused in the growth of another crystal and, when used as reusable material in addition to a reusable ingot which is a non-product portion of a single crystal, enables the effective reuse of non-product portions in single crystal growth.

In the impurity amount control system for manufacturing a single crystal of the present invention, the impurity amount calculator may calculate the amount of impurity in the solidified mass of residual liquid by subtracting from the amount of impurity used when single crystal growth begins, the amount of impurity in the reusable ingot calculated from the resistivity profile formula, and the amount of impurity in the portion of the single crystal rendered into wafers that is determined from the resistivity profile thereof.

This arrangement makes it possible to accurately calculate the amount of impurity present in the solidified mass of residual liquid as a reusable material, thus enabling even solidified masses of residual liquid to be effectively reused in the growth of another single crystal.

As explained above, because the inventive control system and control method determine the resistivity profile curve in a reusable ingot by fitting a resistivity profile curve for a single crystal grown with the same crystal puller and under the same conditions in the past to a resistivity profile accurately revealed as a result of slicing, it is possible to supplement the resistivity profiles of collected reusable ingots at any width that cannot be directly measured.

As a result, in the present invention, with the resistivity profile curves that are supplemented as described above, the amount of impurity present in a reusable ingot can be more accurately calculated than when prior-art representative values are determined, thus suppressing more effectively than in the prior art variations in the resistivity of single crystals grown using reusable ingots, and making it possible to grow single crystals having more precisely controlled resistivities than in the prior art.

BRIEF DESCRIPTION OF THE DRAWINGS

FIG. 2 is a table showing various reusable ingot data stored in the reusable ingot information memory in FIG. 1.

FIG. 3 is a table showing various single crystal data stored in the resistivity profile memory in FIG. 1.

PREFERRED EMBODIMENTS

An impurity amount control system for manufacturing a single crystal according to an embodiment of the invention is described below in conjunction with the accompanying diagrams.

Figure 1:
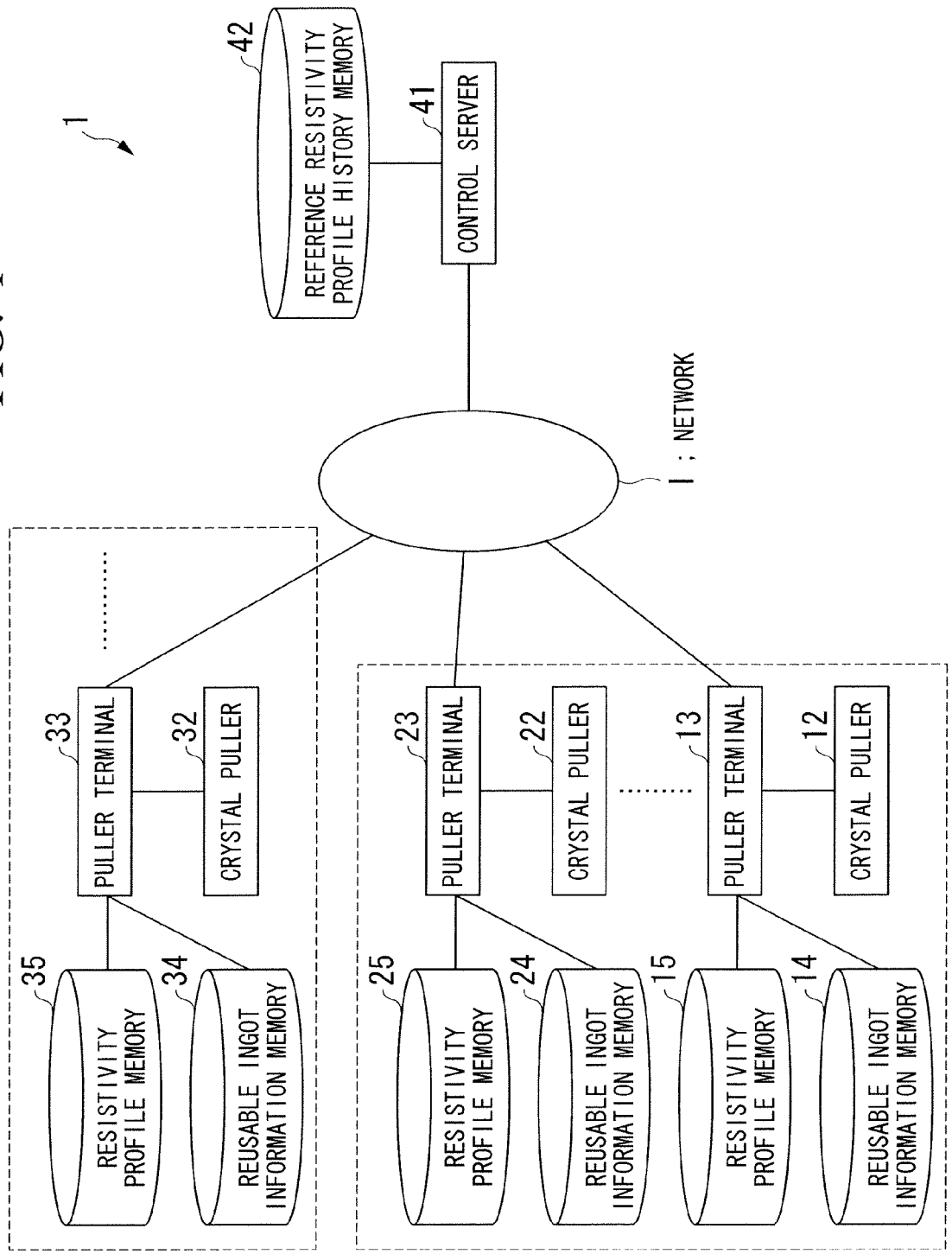
FIG. 1 is a block diagram showing an example of an impurity amount control system for manufacturing a single crystal according to one embodiment of the invention.

FIG. 1 is a block diagram showing an exemplary arrangement according to the same embodiment.

In this embodiment, separate manufacturing facilities A and B each have installed therein a plurality of crystal pullers 12, 22, 32, and carry out the growth of single crystals of desired resistivities.

Each crystal puller 12, 22, 32, has a terminal (e.g., a personal computer) 13, 23, 33, connected thereto. Management of the resistivities and other characteristics of the single crystals that are pulled is carried out as subsequently described in detail.

As shown in FIG. 2, a reusable ingot information memory 14 (or 24, 34) is provided in the crystal puller 12 (or 22, 32) and, for each reusable ingot collected from a single crystal grown by the corresponding individual puller, sequence information including any one or combination of a single crystal identification number, a puller number, an operator identification number, a production number, single crystal bibliographic information, reusable ingot resistivity information, part information, position information and amount of impurity is stored corresponding to an ingot identification number. Likewise, the reusable ingot information memory 24 stores as sequence information for the crystal puller 22, and the reusable ingot information memory 34 stores as sequence information for the crystal puller 24, data of a composition similar to that stored in the reusable ingot information memory 14. The single crystal bibliographic information mentioned above refers to single crystal growth information which includes the amount of starting material charged, the length of single crystal growth, and single crystal diameter information.

Here, the ingot identification number is an identification number which uniquely identifies each reusable ingot. The single crystal identification number is an identification number which uniquely identifies the original single crystal from which the reusable ingot is collected. The puller number is an identification number which uniquely identifies the crystal puller by which a single crystal displaying a single crystal identification number is grown. The operator identification number is a number which uniquely identifies the operator who runs the crystal puller when a single crystal displaying a single crystal identification number is grown. The production number is a number indicating the sequence in which growing operation is carried out on a grown single crystal after replacement of the crucible in the crystal puller.

Figure 8:
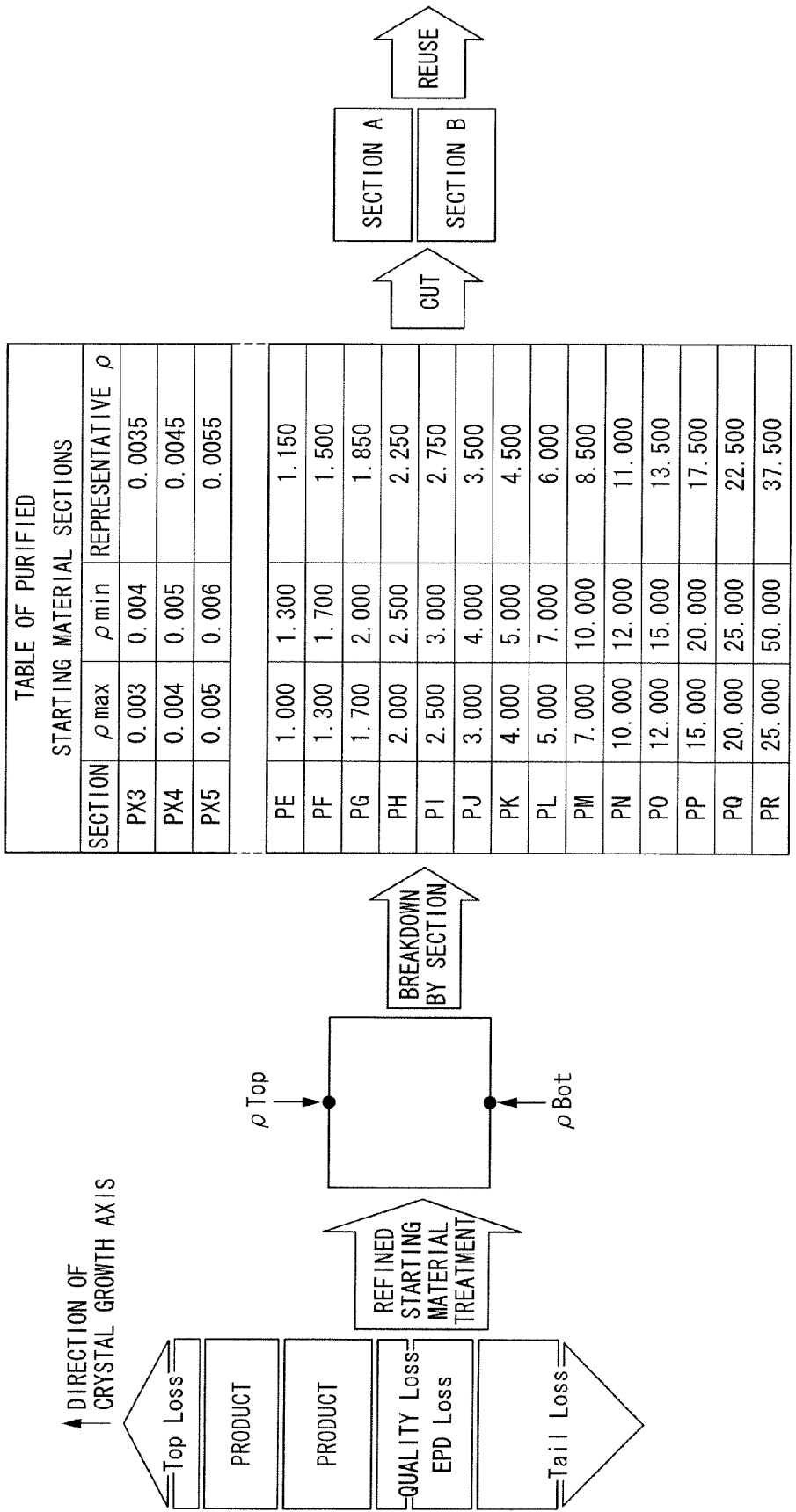
FIG. 8 is a schematic diagram depicting the collection of reusable ingots from a single crystal.

Referring to FIG. 8, the resistivity information is numerical information on the resistivity $\rho$Top measured at the top surface of the reusable ingot in the axial direction of the crystal (pulling direction; i.e., the growth axis direction) and the resistivity $\rho$Bot measured at the bottom surface. Part information is information indicating a part of the single crystal from among the top (vicinity of where single crystal growth begins), body (where the single crystal becomes and remains cylindrical) and tail (vicinity of where single crystal growth ends) of the single crystal. Position information is information indicating the range in positions in the direction of crystal growth where the reusable ingot is taken from a single crystal. The top resistivity $\rho$Top and the bottom resistivity $\rho$Bot are calculated from resistivities sampled at a plurality of places within the respective planes at the top and bottom surfaces of the reusable ingot. The calculations are carried out using an empirical formula derived from past measured values for resistivities, and including position information on the single crystal. The amount of impurity is a quantity which indicates the mass of impurity present in each respective reusable ingot. The method of calculation is explained subsequently in detail.

The resistivity profile memory 15 (or 25, 35) stores the following corresponding to a single crystal identification number: the puller number, the operator identification number, the production number, and a resistivity profile for the portion of the single crystal that is sliced into wafers and thereby rendered into finished product in the single crystal from which the reusable ingot is collected. Although data on the portion of the single crystal from which the reusable ingot is taken is not stored in this profile, through measurements of the resistivities of each wafer, a resistivity profile for the portion of the single crystal which is sliced into finished product is stored together with position information for the respective wafers in the direction of the single crystal growth axis.

As with the above-mentioned top resistivity $\rho$Top and bottom resistivity $\rho$Bot, and as with the resistivities sampled within a plane, the resistivity of each wafer is calculated with an empirical formula derived from past measured values for resistivities, and including position information on the single crystal. In addition, past crystal pulling data such as the weight of the single crystal on the furnace, the charging weight (the sum of the weight of silicon starting material and the weight of impurity charged into the crucible), and the impurity element, are also stored corresponding to a single crystal identification number in the resistivity profile memory 15 (or 25, 35).

The control server 41 has a retriever 411, a simulator 412, an impurity calculator 413 and a registry 414.

The retriever 411 extracts, from among reusable ingots collected from single crystals grown on the various crystal pullers, the ingot identification number of a reusable ingot for which the amount of impurity contained is not calculated, reads ingot information (the impurity element, weight of the reusable ingot, charging weight, weight of single crystal on furnace, ingot diameter, resistivity information, part information, position information, etc. which is part of the sequence information) concerning this reusable ingot from the reusable ingot information memory 14, and outputs that ingot information to the simulator 412.

In addition, the retriever 411 reads out from the resistivity profile memory 15 the resistivity profile for the same single crystal identification number as the above reusable ingot.

The simulator 412 detects the impurity element in the reusable ingot that is the subject of calculations, retrieves a variable set of Irvin curve coefficients for the respective n-type or p-type impurity element (e.g., segregation coefficient, correction factor to be multiplied by the impurity concentration, and specific gravity of the silicon single crystal) using the profile information (any one of or combination of some of the puller number, the operator identification number, and the production number), and generates a tentative profile curve with this variable set.

Next, the simulator 412 fits the tentative profile curve (Irvin curve) to the resistivity profile of the target single crystal, supplements the profiles of missing reusable ingot portions, and calculates a resistivity profile curve for the single crystal from which the reusable ingot is collected. Here, the simulator 412 uses numerical operations to vary the tentative profile curve coefficients so that each numerical value of the above single crystal resistivity profile falls on the tentative profile curve, and carries out processing to change the tentative profile curve to a curve representing the resistivity profile values for the single crystal. This profile curve exhibits the impurity concentrations determined from the resistivities.

In addition, the simulator 412, in calculating the above profile curve, includes the top resistivity $\rho$Top and the bottom resistivity $\rho$Bot of the reusable ingot as resistivity data for the above target single crystal and calculates impurity concentrations from each resistivity, thereby determining a profile curve representing the impurity concentration profile in the above single crystal.

This profile curve is represented by the following formula.

$$Cs = K0 \times C0(1-g)^{K0-1} \quad (1)$$

In the above impurity concentration estimating formula (1) representing the profile curve, Cs is the impurity concentration (atoms/cc) in the crystal, C0 is the impurity concentration (atoms/cc) in the initial melt, K0 is the segregation coefficient, and g is the solidification ratio.

The impurity calculator 413 uses the above formula to calculate the amount of impurity present in a reusable ingot. That is, the simulator 412, at the time this amount of impurity is calculated, calculates the amount of impurity per unit volume (obtained from the impurity concentration as determined from the resistivity, and from the diameter of the single crystal) by using the above formula and integrating over the range of the position information for the reusable ingot. In other words, the amount of impurity contained in the reusable ingot is calculated by integrating the above profile curve using the integral formula shown below.

$$\text{Amount of impurity} = K0 \times C0 \times \int (1-(V \times \rho)/W) dV$$

In the above integral formula, V stands for the volume, $\rho$ is specific gravity, and W is the amount of initially charged impurity (i.e., the amount of impurity charged into the silicon within the crucible). The formula is integrated over a range from V(top) to V(bot).

The registry 414 stores the impurity amount calculated by the impurity calculator 413 in association with the ingot identification number of the above reusable ingot in the reusable ingot information memory, and updates control information for recycling the reusable ingot.

The registry 414 uses a printer (not shown) to print control information for the above reusable ingot onto a label. This label is affixed to the reusable ingot.

Figures 4, 5:
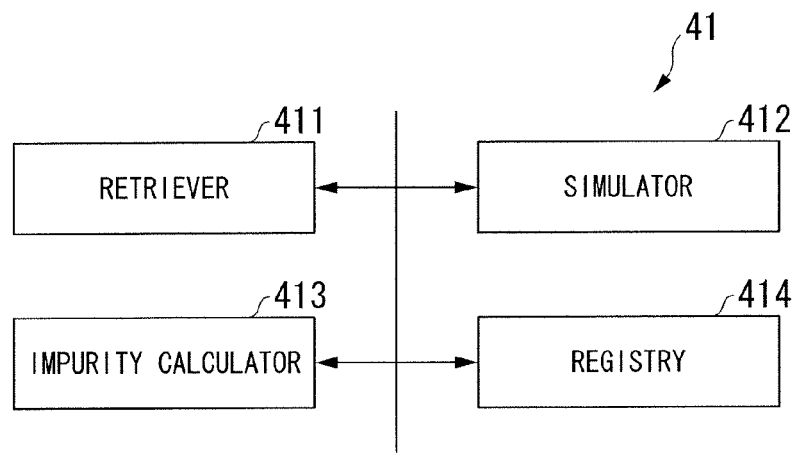
FIG. 4 is a block diagram showing an example of the control server 41 in FIG. 1.
FIG. 5 is a schematic diagram showing an exemplary resistivity profile data arrangement for various data on single crystals produced in the past and stored in the reference resistivity profile history memory in FIG. 1.
Figure 6:
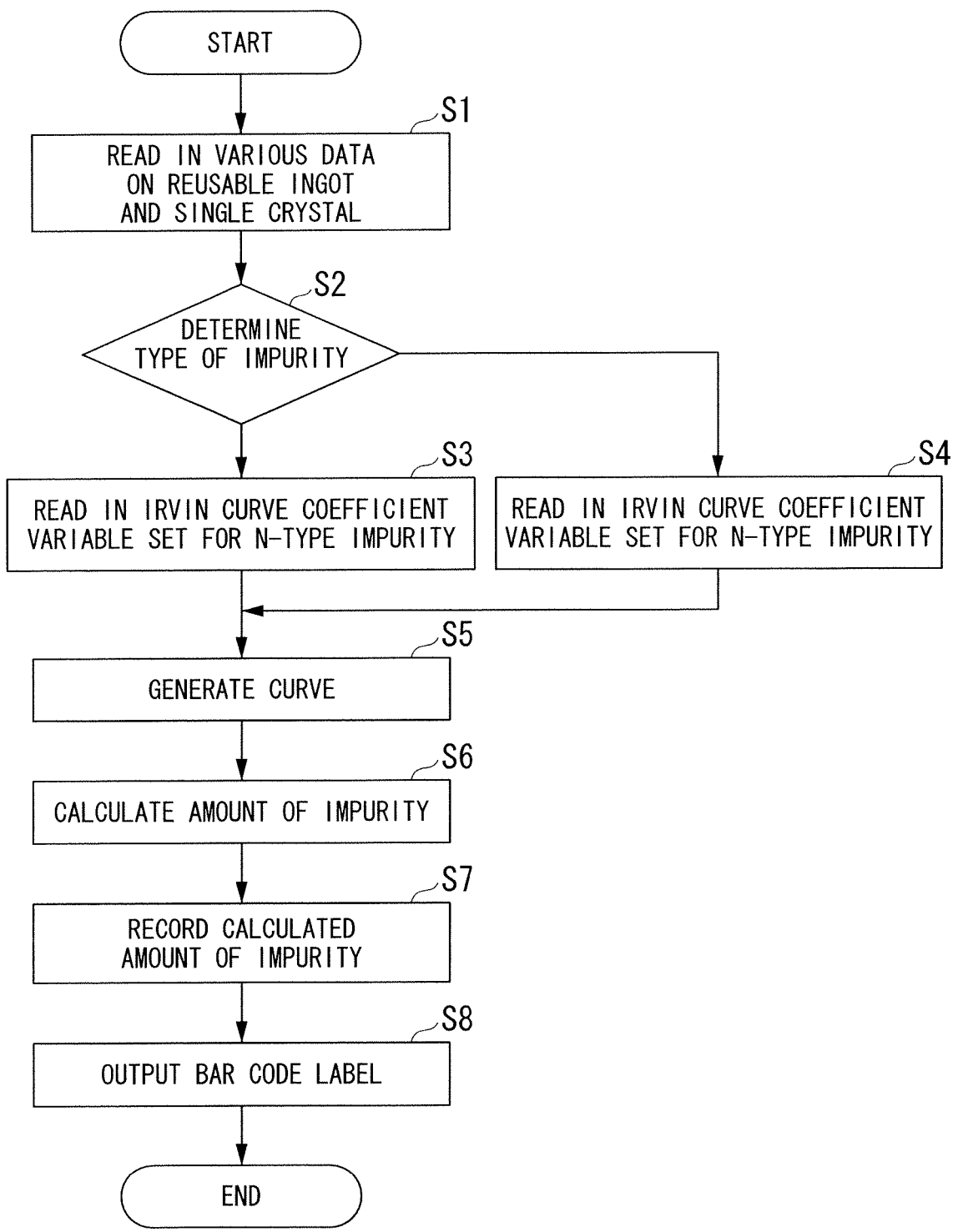
FIG. 6 is a flow chart illustrating the operation of the impurity amount control system for manufacturing a single crystal according to an embodiment of the invention.

Next, the generation of reusable ingot control information in the control of reusable ingots carried out by the impurity amount control system for manufacturing a single crystal according to the present embodiment is described while referring to FIGS. 1, 4 and 6. FIG. 6 is a flow chart illustrating an example of the operation of the impurity amount control system for manufacturing a single crystal according to the present embodiment.

The retriever 411 retrieves information from the reusable ingot information memories 14, 24, 34, extracts a reusable ingot for which the amount of impurity contained is not calculated, and reads out the ingot identification number for the extracted reusable ingot.

Next, the retriever 411 reads in the reusable ingot profile information, resistivity information and part information for the above ingot identification number, and temporarily stores that information in an internal memory.

The retriever 411 then reads out resistivity profile information and past crystal pulling data using the single crystal identification number included in the profile information, and temporarily stores them in the internal memory (Step S1).

Next, in Step S2, the simulator 412 extracts from the profile information the type of impurity present in the reusable ingot, and detects whether it is n-type (phosphorus) or p-type (boron). If the simulator 412 detects that the impurity contained is an n-type impurity, processing moves on to Step S3. On the other hand, if the simulator 412 detects that the impurity is a p-type impurity, processing moves on to Step S4.

In Step S3, the simulator 412 retrieves from the reference resistivity profile history memory 42 an Irvin curve coefficient variable set which matches the profile information of an n-type impurity-doped reusable ingot, reads this variable set, and stores it temporarily in the internal memory, at which point the processing advances to Step 5.

Alternatively, in Step S4, the simulator 412 retrieves from the reference resistivity profile history memory 42 an Irvin curve coefficient variable set which matches the profile information of a p-type impurity-doped reusable ingot, reads this variable set, and stores it temporarily in the internal memory, at which point the processing advances to Step S5.

Next, the simulator 412 uses this variable set to calculate a tentative profile curve (here, for example, to obtain a curve that corresponds to the variable set, the coefficients in a polynomial expression are adjusted) based on formula (1).

In Step S5, using the resistivity profile for the single crystal from which the reusable ingot is collected and the top resistivity $\rho$Top and the bottom resistivity $\rho$Bot, the simulator 412 carries out fitting (by means of, for example, a nonlinear least squares curve fitting method) of the tentative profile curve thus determined, thereby generating a profile curve in which a resistivity profile for the reusable ingot in the crystal growth axis direction is supplemented. This resistivity profile curve is converted into an impurity concentration profile curve.

Next, in Step S6, the impurity calculator 413 uses formula (2) to integrate the above impurity concentration profile curve over the range indicated by the reusable ingot position information, and thereby calculates the amount of impurity present in the reusable ingot. Here, parameters such as the solidification ratio and the impurity concentration calculated from the resistivity will differ depending on the part of the single crystal from which the reusable ingot is taken; that is, whether the reusable ingot is from the top, body or tail of the single crystal. These numerical values are also included in the variable set.

When the amount of impurity is calculated, in the case of a reusable ingot extracted from the reusable ingot information memory 25, the registry 414 writes into the reusable ingot information memory 25, as one item of sequence information, this impurity amount for the ingot identification number (Step S7), and prints control information on the reusable ingot with a printer (Step S8). The user affixes the resulting label to the corresponding reusable ingot, and keeps it at a predetermined place.

Figure 7:
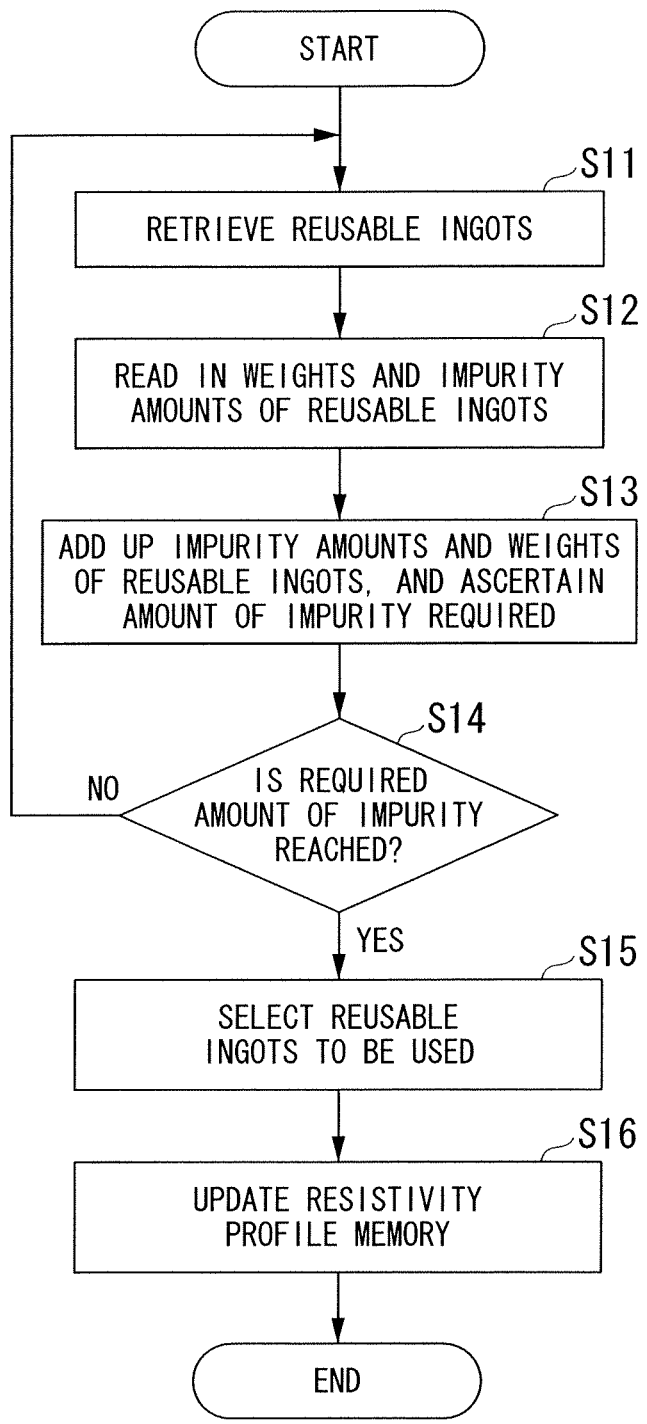
FIG. 7 is a flow chart illustrating the operation of the impurity amount control system for manufacturing a single crystal according to an embodiment of the invention.

Next, the utilization of reusable ingot control information in the control of reusable ingots carried out by the impurity amount control system for manufacturing a single crystal according to the present invention is described while referring to FIGS. 1, 4 and 7. FIG. 7 is a flow chart illustrating an example of the operation of the impurity amount control system for manufacturing a single crystal according to the present embodiment.

When the user utilizes a reusable ingot, by inputting both information indicating whether the required impurity is of the p-type or the n-type and the required amount of impurity, the retriever 411 detects corresponding reusable ingots from the reusable ingot information memories 14, 24 and 34, then tabulates and shows on a display (not shown) the ingot identification numbers for a plurality of detected reusable ingots together with the corresponding control information (i.e., sequence information which includes the amount of impurity). This is Step S111.

The user chooses a reusable ingot by clicking on the desired reusable ingot in the table shown on the display.

As a result, the retriever 411 retrieves, from the reusable ingot information memory 24, reusable ingot control information corresponding to the ingot identification number selected by the user, and reads in the reusable ingot weight and the amount of impurity (Step S12). It is also possible at this time to use a scanner to directly read off the control information affixed to the ingot.

Next, the impurity calculator 413 adds up, respectively, the weights of the reusable ingots input from the retriever 411 and the amounts of impurity present in the ingots, thereby calculating the total weight of the reusable ingots selected by the user and the total amount of impurity in those reusable ingots (Step S13).

Next, the impurity calculator 413 detects whether the amount of impurity that is added up satisfies the required value for recycling that is preset by the user. If the total amount of impurity satisfies the preset value, processing moves on to Step S15. If it does not, processing returns to Step S11.

Once the reusable ingots are selected and it is decided to use them for recycling, the impurity calculator 413 then compiles these selected ingots to be recycled into a table and shows them on a display, and also prints instructions for use that indicate control information and the storage location of each ingot to be recycled (Step S15). Here, the storage location is stored in association with the ingot identification number in each reusable ingot information memory.

The user, in accordance with the written instructions, removes the ingot from the storage location and uses it at one of the crystal pullers to carry out single crystal growth. At the time of actual use, when the resistivity error for a single crystal grown using recycled ingots to adjust the amount of impurity based on the above-described impurity amount estimating operation is compared with the resistivity error for a single crystal re-grown based on a prior-art estimate of the amount of impurity, using the prior-art technique, the error in the resistivity of the grown single crystal is 5% with respect to the anticipated resistivity, whereas the error can be held to within 1% relative to the anticipated resistivity when the estimating method of the present embodiment is used.

With regard also to single crystals obtained by carrying out single crystal growth using reusable ingots, the respective data are controlled in the respective resistivity profile memories.

The registry 414, with regard to a single crystal grown with reusable ingots, relates the ingot identification numbers of the reusable ingots used to the single crystal identification number, and stores this as the use history in the corresponding reusable ingot information memory.

After single crystal growth is carried out, the recovery and use of residue in the crucible is important from the standpoint of impurity reuse. It is conceivable to register and use such residual material in the same way as the reusable ingots described above.

That is, when single crystal growth is carried out, all of the starting material melt within the crucible is generally not used in single crystal growth. To keep slip dislocations and the like from arising in the single crystal during growth, single crystal growth is carried out in such a way so that a small amount of starting material melt remains in the crucible. As a result, a solidified mass of residual liquid which contains the impurity added as an initial dopant forms within the crucible after the single crystal growth.

As described above, in the present embodiment, because the amount of impurity present in a pulled single crystal can be accurately calculated, by subtracting the amount of impurity contained in the pulled single crystal (both the portions rendered into wafers as finished product and the reusable ingot portions) from the amount of impurity initially charged to the crucible, the amount of impurity contained in the solidified mass of liquid remaining in the crucible (part of the reusable material) from the material used to grow the single crystal can be accurately determined. In single crystal growth by a crystal pulling process, reusable materials include the already mentioned reusable ingots and the solidified mass of residual liquid.

After the residual liquid in the quartz crucible is cooled and solidified, by immersing the quartz crucible (containing the solidified mass of residual liquid) in a hydrofluoric acid solution (10 to 20 hours immersion at room temperature), the solidified mass of residual liquid (residue) can be completely recovered without any missing material, thus making it possible to calculate the precise amount of included impurity by means of subtraction as described above.

After the impurity calculator 413 calculates from the above past crystal pulling data the amount of impurity contained in the solidified mass of residual liquid, that is, calculates, as described above, the amount of impurity contained in the single crystal overall, the foregoing operation is carried out by subtracting this amount of impurity from the amount of impurity initially charged. Alternatively, the impurity calculator 413 calculates the weight of the solidified mass of residual liquid by subtracting the weight of the single crystal on the furnace, which is the weight of the overall single crystal after growth, from the charging weight added to the crucible at the start of crystal growth.

The above-described solidified mass of residual liquid can be effectively utilized by control that involves treating the solidified mass as one kind of reusable material, setting the part information type to "residual liquid," assigning the solidified mass of residual liquid an ingot identification number and, like other reusable ingots, storing in the reusable ingot information memory 14 sequence information on each solidified mass of residual liquid as a reusable material to be used in the growth of other single crystals. The generation and the use in the reusable ingot information memory 14 of control information on this solidified mass of residual liquid is carried out in the same way as the generation and the use of control information for a reusable ingot in FIGS. 6 and 7, respectively.

Reusable ingot control processing may be run by recording on a computer-readable recording medium a program for implementing the functions of the control server 31 in FIG. 4, reading the program recorded on this recording medium into the computer system, and running the program. As used herein, "computer system" encompasses operating systems and hardware such as peripheral devices. Alternatively, "operating system" may also encompass World Wide Web systems having a website-providing (or website-displaying) environment. "Computer-readable recording medium" refers to portable media such as floppy disks, magneto-optic disks, ROM disks and CD-ROM disks, and to memory devices such as hard disks built into a computer system. In addition, "computer-readable recording medium" also includes media that hold a program for a fixed length of time, such as volatile memory (RAM) within a server or a client computer system to which the program is sent via a network such as the Internet or via a transmission line such as a telephone line.

Alternatively, the above program may be transmitted from a computer system having this program stored in a memory device or the like to another computer system via a transmission medium or by transmission waves within a transmission medium. Here, the "transmission medium" which transmits the program refers to a medium having the capability of transmitting information, such as a communications network (e.g., the Internet) or a communication line (e.g., a telephone line). Alternatively, the above-mentioned program may be software for implementing some of the foregoing functions, or it may be a so-called differential file (differential program) which is capable of implementing the foregoing functions in combination with a program already recorded in the computer system.

Some preferred embodiments of the invention have been described above, although these embodiments are to be considered in all respects as illustrative and not limitative. Those skilled in the art will appreciate that various additions, deletions, substitutions and other modifications are possible without departing from the spirit and scope of the invention as disclosed in the accompanying claims.

What is claimed is:

1. A non-transitory computer-readable storage medium containing therein a set of computer-readable instructions executable by a processor for performing a process for impurity amount control when using a portion of a single crystal that is not sliced into wafers as reusable material for growing another single crystal, the process for impurity amount control comprising:
    storing a resistivity profile for a portion of a single crystal that is rendered into wafers in a resistivity profile memory;
    simulating to determine, by a simulator, a resistivity profile formula for indicating a resistivity profile within a reusable ingot that is the reusable material from an impurity concentration estimating formula including one or more variables selected from among resistivities at both ends of the reusable ingot in a crystal growth axis direction, an impurity concentration when crystal pulling begins, a segregation coefficient, a solidification ratio and a correction factor, and from the resistivity profile; and
    calculating using an impurity amount calculator, based on the resistivity profile formula, an amount of impurity within the reusable ingot.

* * * * *